United States Patent
Viernes et al.

(10) Patent No.: US 6,856,511 B1
(45) Date of Patent: Feb. 15, 2005

(54) METHODS AND APPARATUS FOR ATTACHING A HEAT SINK TO A CIRCUIT BOARD COMPONENT

(75) Inventors: Rainier Viernes, Fontana, CA (US); Michael Chern, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/621,836

(22) Filed: Jul. 17, 2003

(51) Int. Cl.[7] .............................................. H05K 7/20
(52) U.S. Cl. ..................... 361/704; 361/719; 257/718; 174/16.3
(58) Field of Search ................................ 361/695, 697, 361/704, 719; 257/718, 722, 727; 174/16.3; 165/80.3, 185; 248/505, 510; 24/458, 459

(56) References Cited

U.S. PATENT DOCUMENTS

| | | | |
|---|---|---|---|
| 4,587,595 A | 5/1986 | Staples | 361/710 |
| 5,295,043 A | 3/1994 | Beijer | 361/704 |
| 5,329,426 A | 7/1994 | Villani | 361/719 |
| 5,804,873 A | 9/1998 | Pelly | 257/675 |
| 5,917,700 A * | 6/1999 | Clemens et al. | 361/704 |
| 6,104,612 A | 8/2000 | Holland | 361/704 |
| 6,115,253 A * | 9/2000 | Clemens et al. | 361/704 |
| 6,191,478 B1 * | 2/2001 | Chen | 257/718 |
| 6,193,205 B1 * | 2/2001 | Wang | 248/510 |
| 6,508,300 B1 * | 1/2003 | Hegde | 165/80.3 |
| 6,600,652 B2 * | 7/2003 | Chandran et al. | 361/704 |
| 6,672,892 B2 * | 1/2004 | Chandran et al. | 439/330 |
| 6,728,103 B1 * | 4/2004 | Smedberg | 361/703 |
| 2001/0030037 A1 * | 10/2001 | Hellbruck et al. | 165/80.3 |

* cited by examiner

*Primary Examiner*—Boris Chérvinsky
(74) *Attorney, Agent, or Firm*—Chapin & Huang, L.L.C.; David E. Huang, Esq.

(57) ABSTRACT

A retainer directly attaches to a circuit board component and to a heat sink and secures the circuit board component to the heat sink. The retainer provides a mechanical attachment between the heat sink and the circuit board component. Such mechanical attachment maintains thermal communication between the heat sink and the circuit board component in the absence of a thermally conductive adhesive between the heat sink and the circuit board component for the operational life of the circuit board component. Furthermore, because the retainer attaches directly to the circuit board component and to the heat sink, the retainer minimizes the necessity for use of mounting holes in the circuit board associated with the circuit board component to secure the heat sink to the circuit board component.

26 Claims, 8 Drawing Sheets

METHODS AND APPARATUS FOR ATTACHING A HEAT SINK TO A CIRCUIT BOARD COMPONENT

BACKGROUND

A typical circuit board assembly includes a circuit board formed of circuit board materials (e.g., fiberglass, copper, etc.) and circuit board components mounted to the circuit board. Examples of circuit board components include integrated circuits (ICs), resistors, and inductors. Certain conventional ICs, such as ball grid array (BGA) devices, have an array of solder balls that attach to contact pads, for example, located on the circuit board. The array of solder balls provides mechanical attachment of the BGA device to the circuit board (e.g., attachment to the contact pads of the circuit board) and provides electrical contact between the BGA device and the circuit board.

Conventionally, circuit board components generate heat during operation. A fan assembly typically generates an air stream that passes over, and carries the heat away from, the circuit board components. The air stream removes the heat so that the components do not operate in an unsafe temperature range, i.e., a relatively high temperature range that causes the components to operate improperly (e.g., generate a signal incorrectly) or sustain damage (e.g., overheat, burnout, etc.).

Certain ICs utilize heat sinks to facilitate cooling. In general, a heat sink is a flanged thermally conductive device, such as a metallic device, that contacts a package of the IC. As the IC generates heat, heat flows from the IC package to the heat sink. The air stream generated by the fan assembly travels past the heat sink and carries the heat away from the heat sink and IC, thereby cooling the IC.

Conventional circuit board assemblies use a variety of techniques to secure heat sinks to corresponding IC packages (e.g., circuit board components) in order to maintain thermal communication between the heat sinks and IC packages during operation.

One such technique involves the use of a thermally conductive adhesive to secure the heat sink to the IC package. The thermally conductive adhesive contacts a base plate of the heat sink and a surface of the IC package. The thermally conductive adhesive couples the heat sink and IC package, thereby maintaining thermal communication between the heat sink and the IC package.

Another conventional technique involves the use of fasteners and bolster plates to secure the heat sink to the IC package using the IC's circuit board. Each fastener engages a corresponding mounting hole defined by the heat sink, a mounting hole or through hole defined by the circuit board, and a bolster plate located on a surface of the circuit board component opposite to the surface carrying the IC package. As each fastener engages the corresponding bolster plate, each fastener causes the heat sink to generate a load on the IC package to ensure thermal communication between the heat sink and the IC package.

Another conventional technique involves the use of spring clips to secure the heat sink to the IC package and maintain thermal communication between the heat sink and IC package. The spring clips contact the heat sink and secure the heat sink to the IC package by attaching directly into openings defined by the circuit board in the area of the IC package.

SUMMARY

Conventional techniques for securing a heat sink to a circuit board component suffer from a variety of deficiencies.

As described above, one conventional technique for securing a heat sink to an IC or circuit board component involves the use of a thermally conductive adhesive to secure the heat sink to the circuit board component. However, the adhesive properties of conventional thermally conductive adhesives degrade over time. Such degradation minimizes the ability of the thermally conductive adhesive to couple the heat sink to the circuit board component over time. Over time, therefore, the heat sink can disassociate from the circuit board component and lead to overheating and malfunction of the circuit board component.

Furthermore, certain circuit board components have a relatively large power requirement and utilize relatively large heat sinks to dissipate the heat generated by such circuit board components during operation. The relatively large heat sinks typically have a footprint (e.g., base plate area) larger than the footprint (e.g., top surface area) of the corresponding circuit board component and, using the thermally conductive adhesive, attach to the circuit board component at an "offset" (e.g., the center of gravity of the heat sink is not aligned with the geometric center of the circuit board component). With such an "offset", the heat sink, therefore, generates a cantilever load against the thermally conductive material. As the thermally conductive adhesive degrades over time, the cantilever load causes the heat sink to disassociate from the circuit board component. Such disassociation minimizes thermal transfer from the circuit board component that, in turn, leads to overheating and malfunction of the circuit board component.

Also as described above, another conventional technique for securing a heat sink to an IC or circuit board component involves the use of fasteners and bolster plates to secure the heat sink to the IC package using the IC's circuit board. The fasteners and bolster plates, however, generate a relatively large stress on the corresponding ICs or circuit board components. Certain circuit board components, such as BGA devices, have an array of solder balls securing the circuit board component to the circuit board. Typically, exposing the array of solder balls to a relatively large stress causes the solder balls of the solder ball array to fracture, thereby rendering the associated circuit board component inoperable.

Furthermore, the use of fasteners and bolster plates requires the use of mounting holes within the circuit board associated with the circuit board component. The mounting holes, however, utilize surface area or real estate of the circuit board. By utilizing such real estate, the mounting holes reduce the area available for electronic components and traces on the circuit board.

As described above, another conventional technique involves the use of spring clips to secure the heat sink to the IC package. The spring clips couple the heat sink to the circuit board component and secure the heat sink to the circuit board by attaching directly into openings defined by the circuit board in the area of the circuit board component. The holes for the spring clips, however, are relatively large, thereby reducing the area available for electronic components and traces on the circuit board. Furthermore, in this method, after insertion of the spring clips into the openings, each spring clip directly contacts the edge of each opening. Over time, vibrations in the circuit board can cause the spring clip to wear against the hole, thereby abrading the hole and leading to possible failure of the spring clip.

By contrast, embodiments of the present invention significantly overcome such deficiencies and provide mechanisms for securing a heat sink to a circuit board component.

A retainer directly attaches to the circuit board component and to the heat sink and secures the circuit board component to the heat sink. The retainer provides a mechanical attachment between the heat sink and the circuit board component. Such mechanical attachment maintains thermal communication between the heat sink and the circuit board component in the absence of a thermally conductive adhesive between the heat sink and the circuit board component for the operational life of the circuit board component. Furthermore, because the retainer attaches directly to the circuit board component and to the heat sink, the retainer minimizes the necessity for use of mounting holes in the circuit board associated with the circuit board component to secure the heat sink to the circuit board component.

In one arrangement the retainer has a base portion, a plurality of arms coupled to the base portion, and a plurality of tabs coupled to the plurality of arms. Each of the plurality of tabs is configured to move between a first position and a second position relative to the base portion. The base portion, the plurality of arms, and the plurality of tabs are configured to capture at least a portion of the heat sink and at least a portion of the circuit board component when the plurality of tabs move from the first position to the second position to secure the heat sink to the circuit board component. The retainer provides a mechanical attachment between the heat sink and the circuit board component thereby minimizing the need for a thermal adhesive to secure the heat sink and the circuit board component. Furthermore, the retainer captures (e.g., attaches directly to) both the circuit board component and the heat sink thereby minimizing the need to use mounting holes in the circuit board associated with the circuit board component to secure the retainer to the circuit board.

In one arrangement, the base portion, the plurality of arms, and the plurality of tabs are integrally formed, such as from a nonconductive material. In such an arrangement, the retainer can be formed through a stamping process and produced at a relatively low cost. Furthermore, in such an arrangement, the retainer forms a self-contained unit that requires no additional components or elements to secure a heat sink to a circuit board component and, therefore, lowers circuit board assembly manufacturing costs.

In one arrangement, each of the plurality of tabs is configured to position between two adjacent fins of the heat sink. Such an arrangement minimizes movement of the arms associated with the tabs relative to the circuit board component that, in turn, minimizes the potential for the retainer to become disengaged from heat sink and the circuit board component.

In one arrangement, the base portion comprises a first rail, a second rail integrally formed with and substantially perpendicular to the first rail, and a third rail integrally formed with and substantially perpendicular to the second rail. The first rail, the second rail, and the third rail are configured to engage a slot along a perimeter portion of the circuit board component. In such an arrangement, the slot of the circuit board component provides a coupling location on the circuit board component for the retainer. Use of the slot as a coupling location for the retainer allows the retainer to secure the heat sink to the circuit board component without requiring placement of mounting holes within a circuit board associated with the circuit board component to secure the retainer to the circuit board.

The features of the invention, as described above, may be employed in systems, devices and methods for attaching a heat sink to a circuit board component as well as other computer-related components such as those of Cisco Systems of San Jose, Calif.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the present invention provide mechanisms for securing a heat sink to a circuit board component. A retainer directly attaches to the circuit board component and to the heat sink and secures the circuit board component to the heat sink. The retainer provides a mechanical attachment between the heat sink and the circuit board component. Such mechanical attachment maintains thermal communication between the heat sink and the circuit board component in the absence of a thermally conductive adhesive between the heat sink and the circuit board component for the operational life of the circuit board component. Furthermore, because the retainer attaches directly to the circuit board component and to the heat sink, the retainer minimizes the necessity for use of mounting holes in the circuit board associated with the circuit board component to secure the heat sink to the circuit board component.

Figure 1:
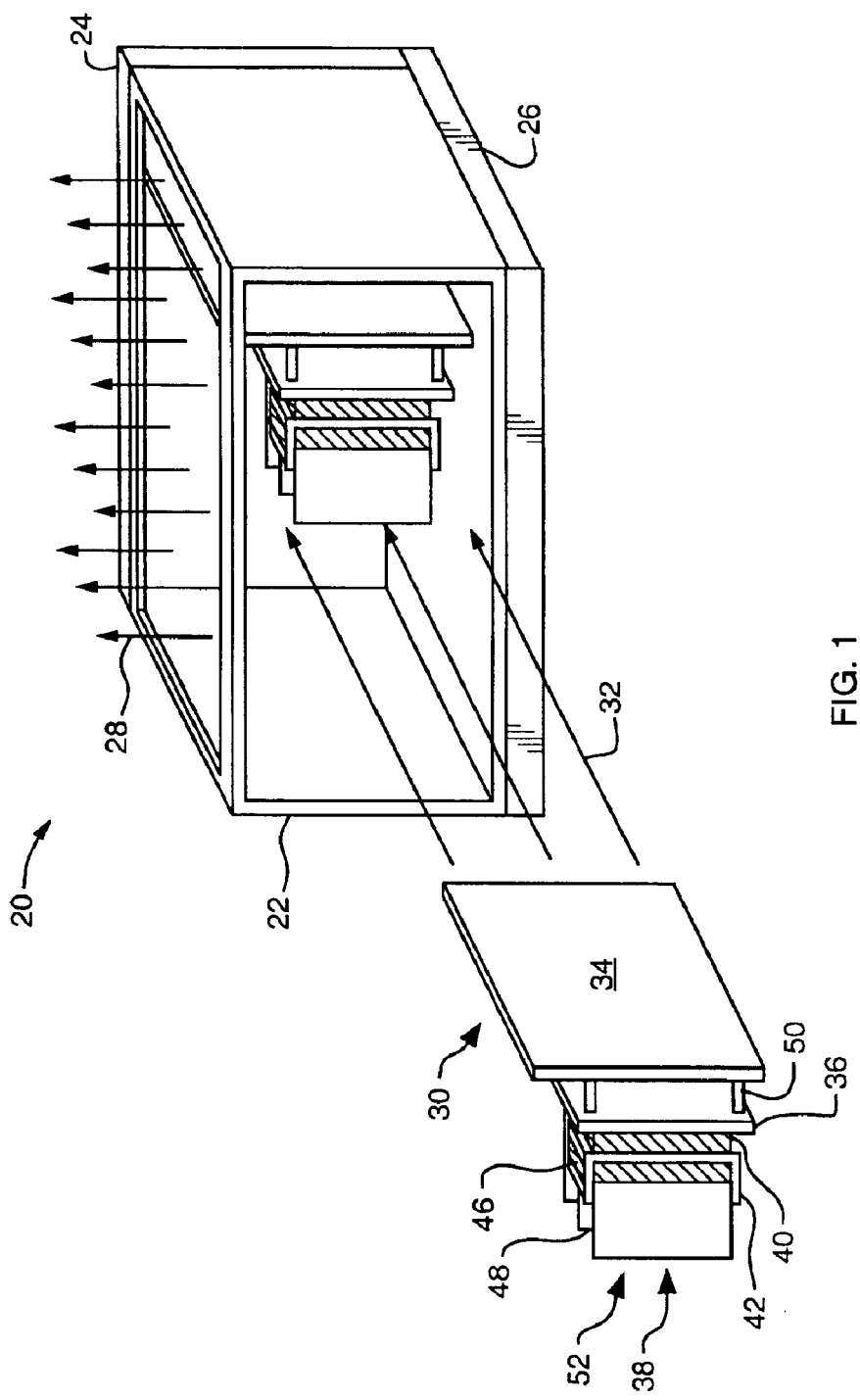
FIG. 1 illustrates a block diagram of a computer system using a retainer to secure a heat sink to a circuit board component, according to one embodiment of the invention.

FIG. 1 shows a computer system 20, suitable for use of the invention. The computer system 20 includes a card cage 22, a back plane 24, and a fan assembly 26 that provides an air stream 28 that flows through the card cage 22. The system 20 further includes multiple circuit board assemblies 30 which connect with the back plane 24 when installed in the card cage 22 in the direction 32.

Each circuit board assembly 30 includes, for example, a circuit board 36, a circuit board component 40 mounted to the circuit board 36, a beat sink 38, a retainer 42, and a support member 34.

Figure 3:
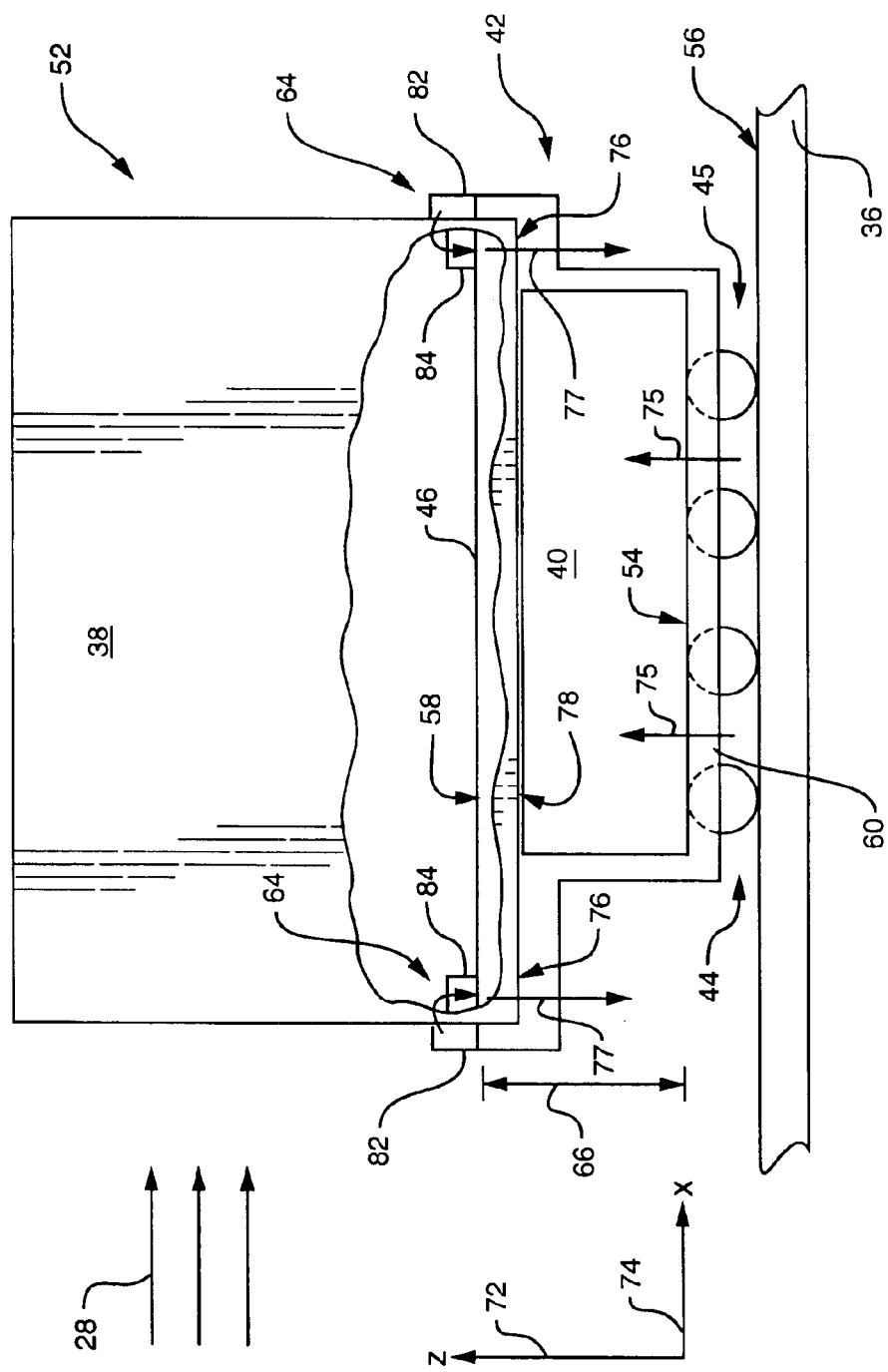
FIG. 3 illustrates, along a y-direction, a first side view of a heat sink assembly having the retainer of FIG. 1, according to one embodiment of the invention.

In one arrangement, the circuit board component 40 attaches to the circuit board 36 using a solder ball array 44, such as illustrated in FIG. 3, for example. The solder ball array 44 forms a solder joint 45 between the circuit board component 40 and the circuit board 36. The solder joint 45 provides mechanical attachment of the circuit board component 40 to the circuit board 36 and provides electrical contact between the circuit board component 40 and the circuit board 36.

Returning to FIG. 1, the heat sink 38 facilitates cooling of the circuit board component 40. For example, the heat sink 38 is made from a material having relatively high heat absorption characteristics (e.g., a metallic material such as aluminum) to allow heat transfer from the circuit board component 40 to the heat sink 38. The heat sink 38, in one arrangement, has a base plate 46 and fins 48 (e.g., extending from the base plate 46) to aid in heat transfer from the circuit board component 40. The base plate 46 couples to the circuit board component 40 such that the fins 48 of the heat sink 38 orient within the card cage 22, and relative to the air stream 28 provided by the fan assembly 26, to allow the air stream 28 to flow across the fins 48. In such an arrangement, the fins 48 minimally impinge upon the air stream 28. The base plate 46 absorbs heat from the circuit board component 40 and transfers the heat to the fins 48. As the air stream 28 travels past the surface area of the fins 48, the air stream 28 carries heat away from the heat sink 38 (e.g., provides convective cooling), thereby cooling the circuit board component 40.

The support member or carrier tray 34 couples to the circuit board 36 via side portions or stand-offs 50 attached to the support member 34 and operates as a carrier for holding the circuit board 36 in place for proper alignment and connection with the back plane 24. In one arrangement, the support member 34 includes a metallic material that shields circuitry of the circuit board assembly 30 from external electromagnetic interference (EMI) sources and that shields external circuitry from EMI generated by the circuitry of the circuit board assembly 30.

The retainer 42 provides a mechanical attachment between the heat sink 38 and the circuit board component 40. The retainer 42 couples directly to the circuit board component 40 and to the heat sink 38 to secure and provide thermal communication between the circuit board component 40 and the heat sink 38. Together, the retainer 42 and the heat sink 38 form a heat sink assembly 52.

Figure 2:
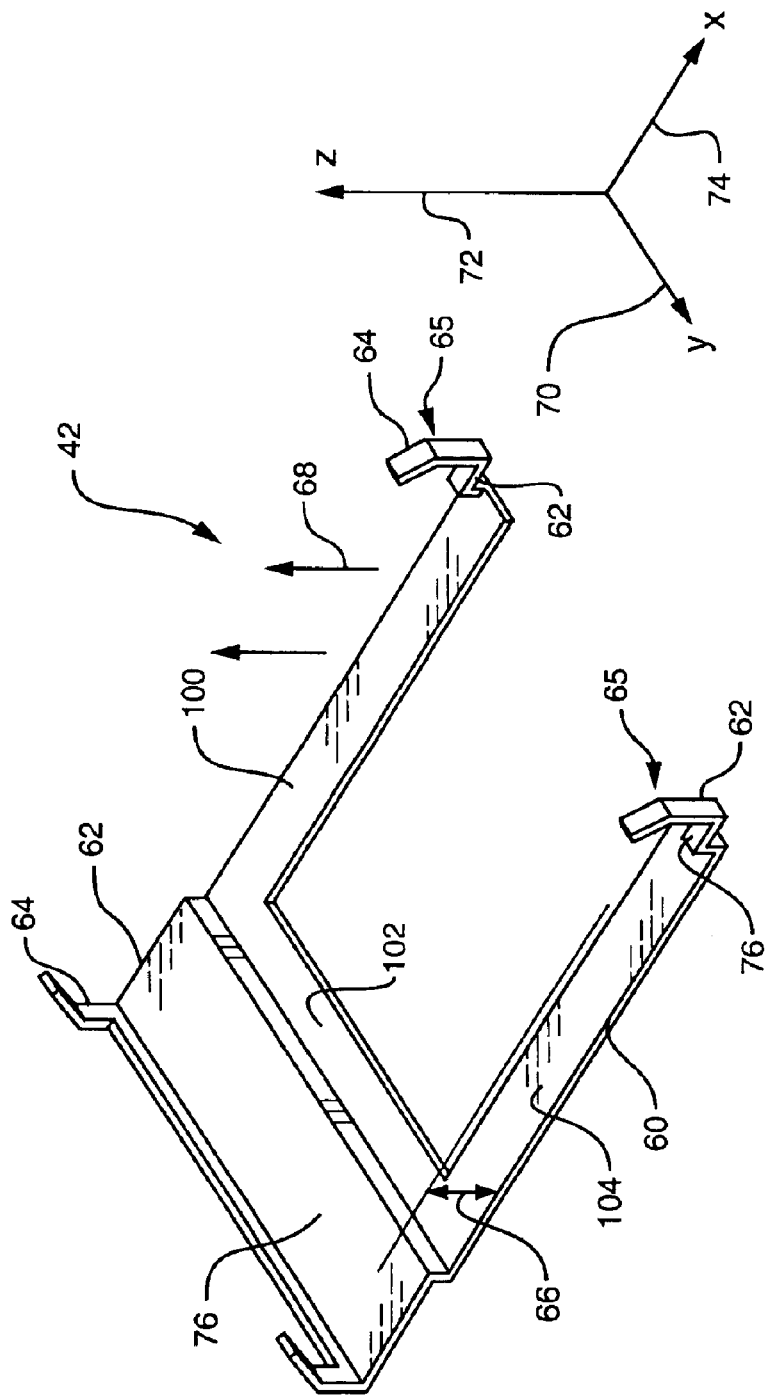
FIG. 2 illustrates a perspective view of the retainer of FIG. 1, according to one embodiment of the invention.

FIG. 2 illustrates one arrangement of the retainer 42. The retainer 42 has a base portion 60, arms 62 coupled to the base portion 60, and tabs 64 coupled to the arms 62. In one arrangement, the base portion 60, arms 62, and tabs 64 are integrally formed as a single component from a single material. For example, a manufacturer stamps a retainer "blank" from a sheet of material, such as a stainless-steel material. The manufacturer bends the retainer "blank" to form the arms 62 and tabs 64, relative to the base portion 60, to form the retainer 42.

Figure 4:
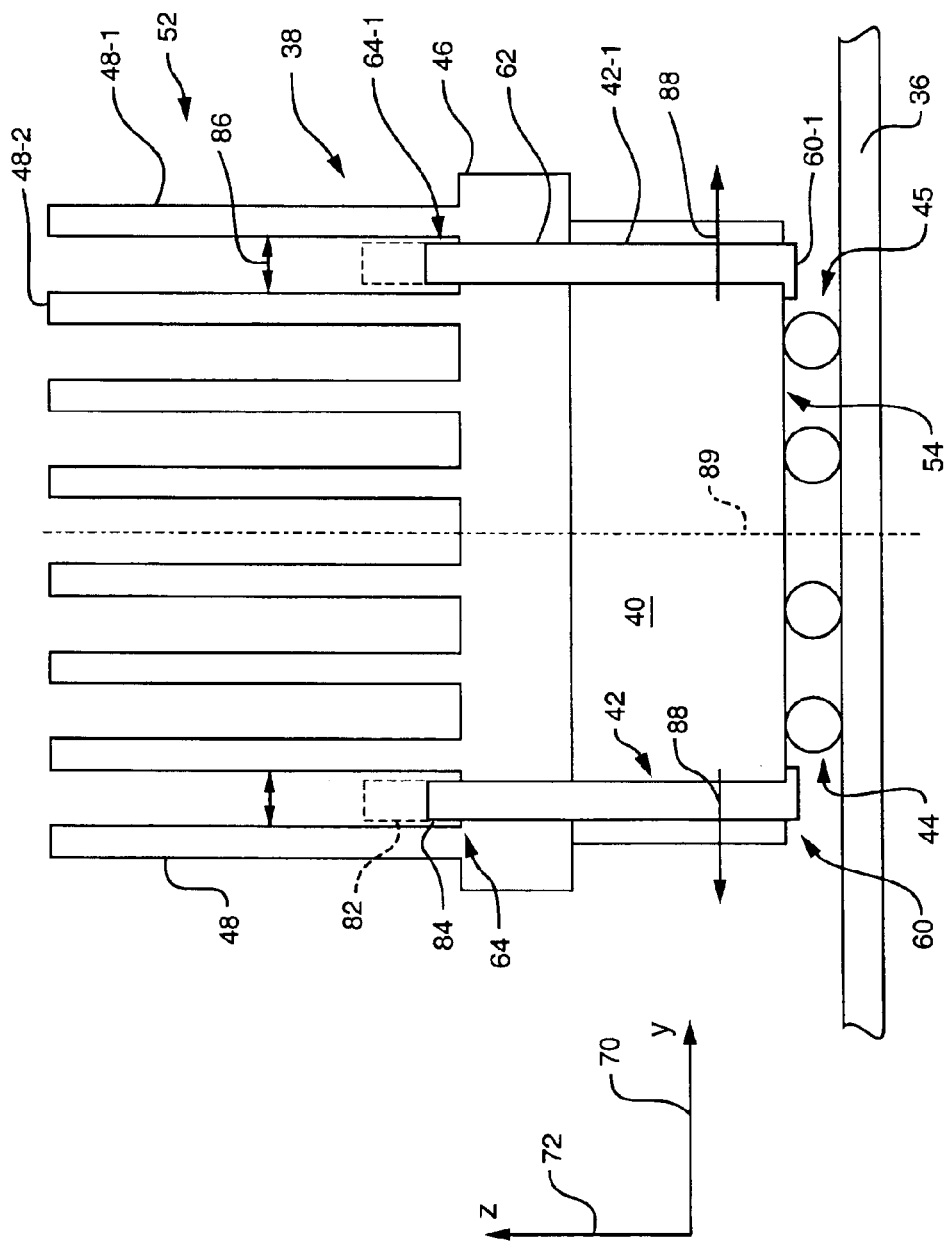
FIG. 4 illustrates, along an x-direction, a second side view of the retainer of FIG. 1 engaging a circuit board component, according to one embodiment of the invention.

The base portion 60 is configured contact or attach to the circuit board component 40 to aid in securing the heat sink 38 to the circuit board component 40. The base portion 60, in one arrangement, has a first rail 100, a second rail 102, and a third rail 104. The first rail 100 is integrally formed with, and substantially perpendicular to, the second rail 102. The third rail 104 is integrally formed with, and substantially perpendicular to, the second rail 102. In such an arrangement, the base portion 60 of the retainer 42 forms a bracket shape. For example, the bracket shape of the base portion 60, as illustrated in FIGS. 3 and 4, allows the base portion 60 to contact a surface 54 of the circuit board component 40 (e.g., the base portion orients between the surface 54 of the circuit board component 40 and the surface 56 of the circuit board 36) when the retainer 42 secures the beat sink 38 to the circuit board component 40. Such a configuration provides contact between the retainer 42 and the circuit board component 40 when the retainer secures the heat sink 38 to the circuit board component 40.

Returning to FIG. 2, the arms 62 of the retainer 42 connect the base portion 60 to the tabs 64 of the retainer 42. The arms 62 form an offset 66 between the tabs 64 and the base portion 60. The offset 66 allows the retainer 42 to capture (e.g., partially surround) the circuit board component 40 and the heat sink 38 during an assembly procedure, thereby allowing the retainer 42 to secure the heat sink 38 to the circuit board component 40. For example, in one arrangement, a length of the offset 66 is substantially equal to a thickness of the base plate 46 combined with a thickness of the circuit board component 40 (e.g., the offset 66 accounts for a height of the circuit board component 40 and a height of the base plate 46 of the heat sink 38). Such a length of the offset 66 allows the base portion 60 and the tabs 64 to generate a stress on the heat sink 38 and the circuit board component 40 sufficient to maintain thermal communication between the heat sink 38 and the circuit board component 40 and to minimize or prevent damage the circuit board component 40.

In one arrangement, the arms 62 form an alignment platform 76 for the heat sink 38. The alignment platform 76 orients the heat sink 38, relative to the circuit board component 40 and the retainer 42, to provide thermal communication between the heat sink 38 and the circuit board component 40 and to provide mechanical contact between the heat sink 38 and the tabs 64 of the retainer. For example, as illustrated in FIG. 3, during assembly, an assembler places the retainer 42 (e.g., the base portion 60 of the retainer 42) in contact with the circuit board component 40. The alignment platform 76 of the retainer 42 defines a planar surface that is coplanar with a heat sink interface 78 of the circuit board component 40 (e.g., a surface of the circuit board component 40 configured to thermally communicate with a heat sink 38). When the assembler places the heat sink 38 within the retainer 42, the heat sink base 46 contacts the alignment platform 76. The alignment platform 76, in turn, orients the heat sink 38 with respect to the circuit board component 40 such that the heat sink base 46 contacts the heat sink interface 78 of the circuit board component 40. The alignment platform 76 formed by the arms 62 of the retainer 42, therefore, ensures thermal communication between the heat sink 38 and the circuit board component 40.

Returning to FIG. 2, each tab 64 of the retainer 42 is configured bend or move relative to the base portion 60 to aid in securing the heat sink 38 to the circuit board component 40. Each tab 64 forms a joint 65 with an associated arm 62 of the retainer 42. For example, during the retainer manufacturing process a manufacturer can form the joint 65 in the retainer 42 by scoring or thinning the material located between each tab 64 and each arm 62. The joints 65 allow the tabs 64 to move relative to the base portion 60 of the retainer 42 to secure the heat sink 38 to the circuit board component 40 and limit vertical motion of the heat sink 38, along the z-axis direction 70, relative to the circuit board component 40.

The base portion 60, the arms 62, and the tabs 64 of the retainer 42 work in conjunction with each other to secure the heat sink 38 to the circuit board component 40. The retainer 42 secures to the heat sink 38 and to the circuit board component 40 to provide a mechanical attachment between the heat sink 38 and the circuit board component 40, thereby minimizing the need for a thermal adhesive between the heat sink 38 and the circuit board component 40. Furthermore, the retainer 42 attaches directly to both the circuit board component 40 and the heat sink 38 thereby minimizing the need to use mounting holes in the circuit board 36 associated with the circuit board component 40 to secure the retainer 42 to the circuit board 36. Such a configuration maximizes the availability of real estate on the surface of the circuit board 36 for additional components or electrical traces.

FIG. 3 illustrates the base portion 60, the arms 62, and the tabs 64 of the retainer 42 securing the heat sink 38 to the circuit board component 40.

During an attachment procedure (e.g., attachment of the heat sink 38 to the circuit board component 40) a manufacturer places the base portion 60 of the retainer 42 in contact with a surface 54 of the circuit board component 40. For example, as shown in FIG. 3, the base portion 60 contacts a surface 54 of the circuit board component 40 and orients between the surface 54 of the circuit board component 40 and a surface 56 of the circuit board 36.

The assembler places the heat sink 38 within the retainer 48 such that the arms 62 of the retainer 42 (e.g., the alignment platform 76) orients the heat sink 38, relative to the circuit board component 40 and the retainer 42, to provide thermal communication between the heat sink 38 and the circuit board component 40. The arms 62, in one arrangement, contact the beat sink 38 to aid in maintaining thermal communication between the heat sink 38 and the circuit board component 40 during operation of the circuit board component 40. For example, contact between the arms 62 and the heat sink 38 limits vertical motion of the heat sink 38, along an x-axis direction 74, relative to the circuit board component 40. Such limitation minimizes separation of the heat sink 38 from the circuit board component 40 during operation of the circuit board component 40.

As described above, each tab 64 of the retainer 42 is configured bend or move relative to the base portion 60 to aid in securing the heat sink 38 to the circuit board component 40. For example, the tabs 64 move or bend between a first position 82 and a second position 84 relative to the base portion 60. Prior to placing the heat sink 38 within the retainer 48, the assembler places the tabs 64 in the first position 82 to allow heat sink 38 to thermally communicate with the circuit board component 40. The assembler then moves the tabs 64 to the second position 84 such that the tabs 64 contact the heat sink 38 (e.g., contact an attachment surface 58 of the base plate 46 of the heat sink 38).

Because the tabs 64 are configured to move between the first position 82 and second position 84, an assembler can remove an installed heat sink 38 from associated circuit board component 40 by bending the tabs 64 from the second position 84 to the first position 82. The tabs 64, therefore, allow reworking of the heat sink assembly 52. For example, the tabs 64 allow an assembler to remove the heat sink 38 from malfunctioning circuit board component 40, replace the malfunctioning circuit board component 40 with a functioning circuit board component, and reattach the heat sink 38 to the circuit board component 40.

Contact between the tabs 64 and the heat sink 38 and contact between the base portion 60 and the circuit board component 40 captures a portion of the heat sink 38 and a portion of the circuit board component 40 within the retainer 42 to secure the heat sink 38 to the circuit board component 40. For example, as the assembler places the tabs 64 in contact with the heat sink 38, the tabs 64 generate a first force 75 against the heat sink 38. In turn the base portion 60 generates an equal and opposite second force 77 on the circuit board component 40. The first force 75 and the second force 77 generated by the retainer 42, secures the heat sink 38 to the circuit board component 40 and, therefore, limits both vertical motion of the heat sink 38 along a z-axis direction 70 and lateral motion of the heat sink 38 along a y-axis direction 70 relative to the circuit board component 40.

FIG. 4 illustrates an arrangement of the retainer 42 where the tabs 64 of the retainer 42 are configured to position between adjacent fins 48 of the heat sink 38. Such a configuration helps to minimize lateral movement 88 of the arms 62 (e.g., movement away from a central axis 89 of the circuit board component 40) along the y-axis direction 70 and, therefore, minimize the potential for the retainer 42 to become disengaged from heat sink 38 and the circuit board component 40.

For example, during an assembly procedure, an assembler places the base portion 60 of the retainer 42 in communication with the circuit board component 40. When the assembler places the heat sink 38 within the retainer 48, the assembler also aligns the fins 48 of the heat sink 38 relative to the tabs 64 of the retainer 42 such that the tabs 64 position between two adjacent fins 48 of the heat sink 38. For example, as illustrated in FIG. 4, tab 64-1 positions between fins 48-1 and 48-2 of the heat sink. The assembler then moves the tab 64-1 from the first position 82 to the second position 84 such that the tab 64-1 contacts the base plate 46 of the heat sink. The adjacent fins 48-1 and 48-2 constrain lateral motion of the tab 64-1 (e.g., motion along the y-axis 70 direction) within a space 86 defined between the fins 48-1, 48-2. By minimizing lateral movement of the tab 64-1, the adjacent fins 48-1, 48, in turn, minimize lateral movement 88 of the arm 62-1 and the base portion 60-1 associated with the tab 64-1 relative to both heat sink 38 and the circuit board component 40. Positioning of the tabs 64 between adjacent fins 48, therefore, helps to minimize the potential for the retainer 42 to become disengaged from heat sink 38 and the circuit board component 40.

FIGS. 3 and 4 illustrate the retainer 42 attaching to both the heat sink 38 and the circuit board component 40 to secure the heat sink 38 to the circuit board component 40. In the arrangement shown, the base portion 60 contacts the surface 54 of the circuit board component 40 and orients between the circuit board component 40 and the surface 56 of the circuit board 36.

Figure 5:
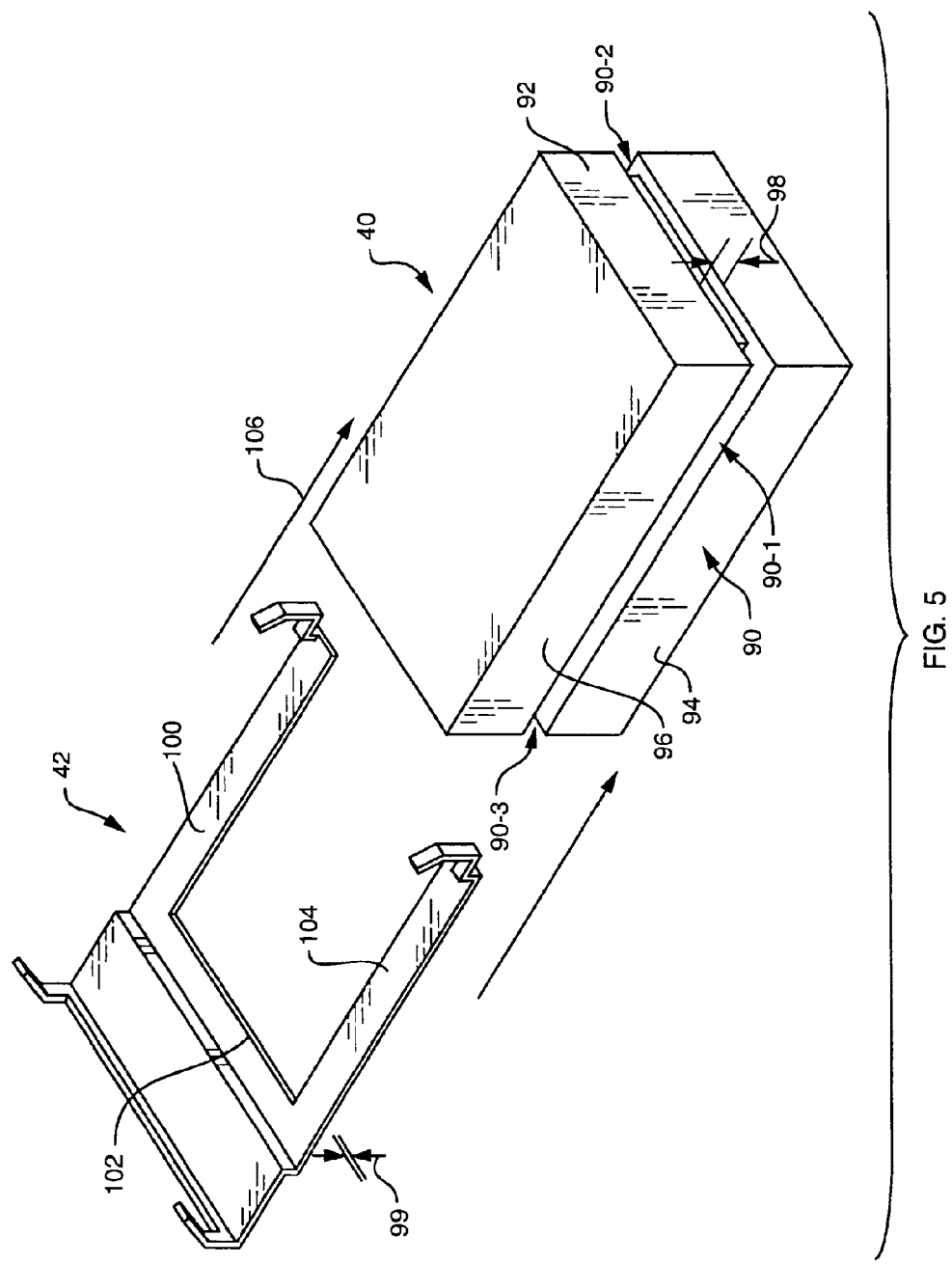
FIG. 5 illustrates a perspective view of a circuit board assembly having the retainer, according to one embodiment of the invention.

FIG. 5 illustrates an arrangement of the retainer 42 attaching or coupling to the circuit board component 40. As illustrated, the circuit board component 40 has a slot 90 along a perimeter portion 92 of the circuit board component 40. The circuit board component 40 defines the slot 90, for example, between a lower portion 94 of the circuit board component package and an upper portion 96 of the circuit board component package. In one arrangement, the lower portion 94 of the circuit board component 40 is formed of a ceramic substrate while the upper portion 96 is formed of aluminum material, such as found in a ceramic column grid array (CCGA) application specific integrated circuit (ASIC) or a ceramic ball grid array (CBGA) ASIC.

In one arrangement, the slot 90 defines a slot height 98 that is greater than a thickness 99 of the retainer 42. For example, in the case where the retainer 42 has a thickness of 0.015 inches, the slot height 98 of the slot 90 is larger than 0.015 inches to allow installation of the retainer 42 on the circuit board component 40 and to minimize binding or jamming of the retainer 42 within the slot 90 during an installation procedure.

As described above, the base portion 60 of the retainer has the first rail 100 integrally formed with, and substantially perpendicular to, the second rail 102 and has the third rail 104 integrally formed with, and substantially perpendicular to, the second rail 102. The rails 100, 102, 104 of the base portion 60 engage the slot 90 of the circuit board component 40 along the direction 106. For example, the third rail 104 engages slot potion 90-1 and the first rail 100 engages slot portion 90-2. The third rail 90-1 and the first rail 100 slide within slot portions 90-1 and 9-2, respectively, until the second rail 102 engages slot portion 90-3 of the circuit board component 40.

During the assembly process, after engaging the retainer with the circuit board component 40, an assembler places the heat sink 38 in thermal communication with the circuit board component 40. The assembler places the tabs 64 in contact with the heat sink 38 and captures the heat sink 38 and a portion of the circuit board component 40 within the retainer 42 to secure the heat sink 38 to the circuit board component 40. The slot 90 of the circuit board component 40, therefore, provides a coupling location on the circuit board component 40 for the retainer 42. Use of the slot 90 as a coupling location for the retainer 42 allows the retainer 42 to secure the heat sink 38 to the circuit board component 40 without requiring the use of an adhesive to secure the heat sink 38 to the circuit board component 40. Furthermore, use of the slot 90 as a coupling location for the retainer 42 allows the retainer 42 to secure the heat sink 38 to the circuit board component 40 without requiring placement of mounting holes within the circuit board 36 associated with the circuit board component 40 to secure the retainer 42 to the circuit board 36.

Figure 6:
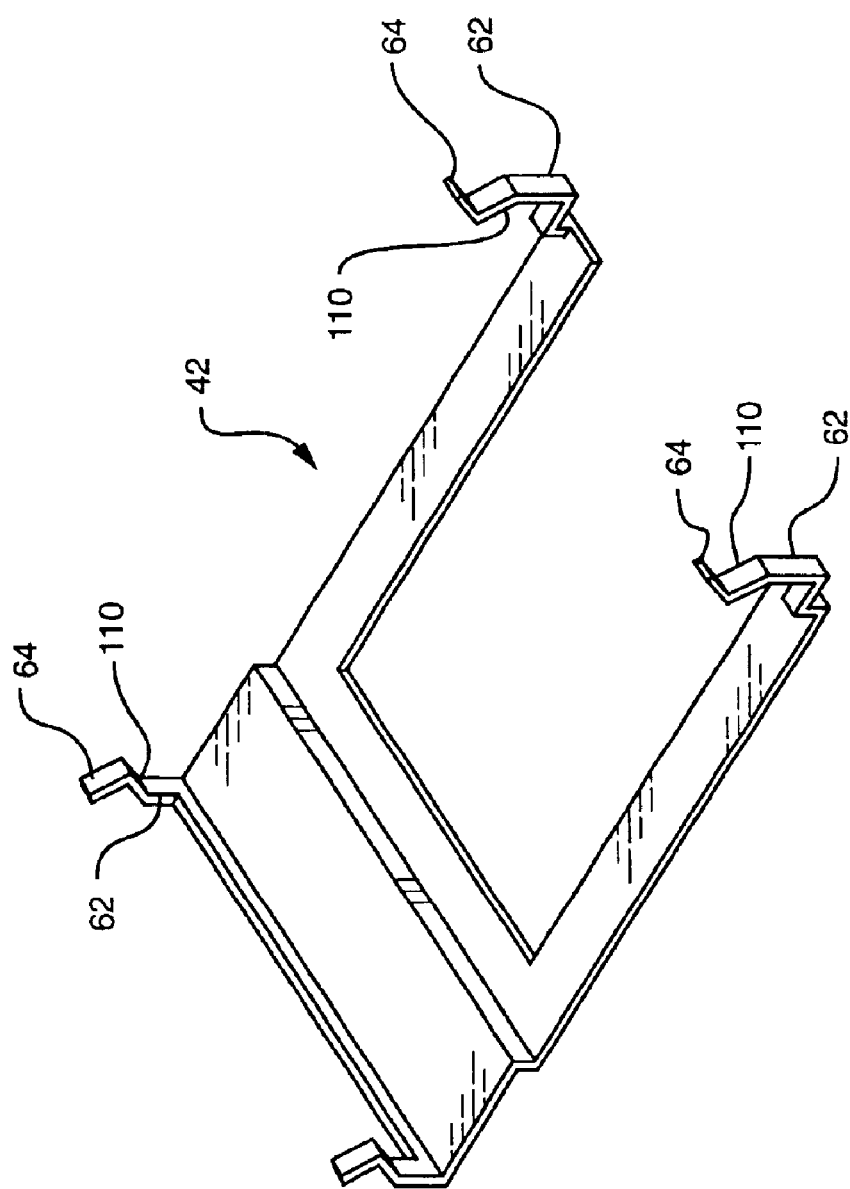
FIG. 6 illustrates a perspective view of a retainer and circuit board component, according to one embodiment of the invention.

FIG. 6 illustrates an arrangement of the retainer 42 where the retainer 42 has a latch 110 connected to, and located between, each arm 62 and each tab 64 of the retainer 42. In one arrangement, the latch 110 is integrally formed between the arm 62 and the tabs 64 associated with each arms 62. The latch 110 provides a "snap-in" function for the heat sink 38 during a heat sink attachment procedure and helps to secure the heat sink 38 to the circuit board component 40. The latch 110 acts as a lever that allows an assembler to bend or deflect the arms 62 of the retainer 42 during installation of a heat sink 38 with the retainer 42 and causes the arms 68 to retract (e.g., snap) against the heat sink 38 as the heat sink 38 thermally engages (e.g., thermally communicates with) the circuit board component 40.

Figure 7A:
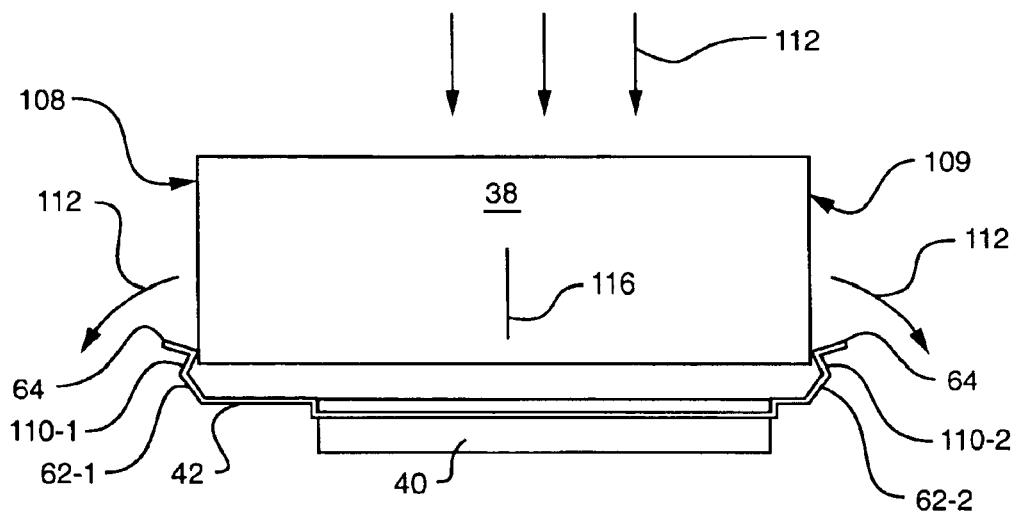
FIGS. 7A and 7B illustrate attachment of a heat sink to the retainer of FIG. 6, according to one embodiment of the invention.
Figure 7B:
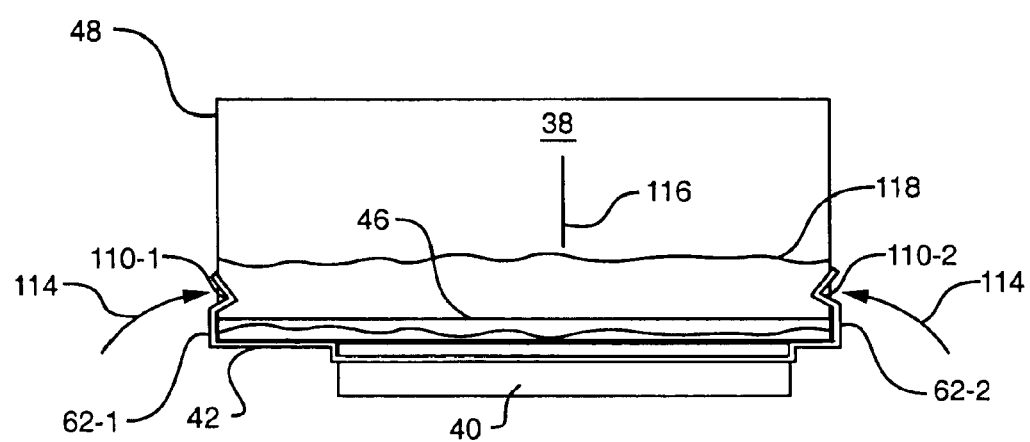

FIGS. 7A and 7B illustrate an arrangement for operation of latches 110-1, 110-2 during a heat sink attachment procedure where the heat sink 38 inserts within the retainer 42.

In FIG. 7A, an assembler inserts the heat sink 38 into the retainer 42 along direction 112. The heat sink 38 contacts the latches 110-1, 110-2 (e.g., contacts the junction of the latches 110-1 and 110-2 and the corresponding tabs 64) substantially simultaneously. Such contact causes the latches 110-1 and 110-2 to deflect 112 the corresponding arms 62-1, 62-2 of the retainer 42 relative to a central axis 116 of the heat sink 38, thereby allowing the assembler to insert the heat sink 38 into the retainer 42.

In FIG. 7B, as the heat sink 38 thermally contacts the circuit board component 40, the heat sink 38 (e.g., the base plate 46 of the heat sink 38) disassociates from the junction of the latches 101-1 and 110-2 and the corresponding tabs 64. As the heat sink 38 contacts the circuit board component 40, the latches 110-1 and 110-2 retract 114 the corresponding arms 62-1, 62-2 toward the central axis 116 of the heat sink 38 (e.g., to an initial, unengaged position). As shown by the cutaway 118 in the heat sink fin 48, such retraction 114 causes the latches 110-1, 110-2 to contact the base plate 46 of the heat sink 46. The retraction 114 of the arms 62-1, 62-2 and the latches 110-1, 110-2 allows a "snap-in" of the heat sink 38 within the retainer 42 and provides an auditory feedback to the assembler indicating thermal contact between the heat sink 38 and the circuit board component 40.

Figure 8:
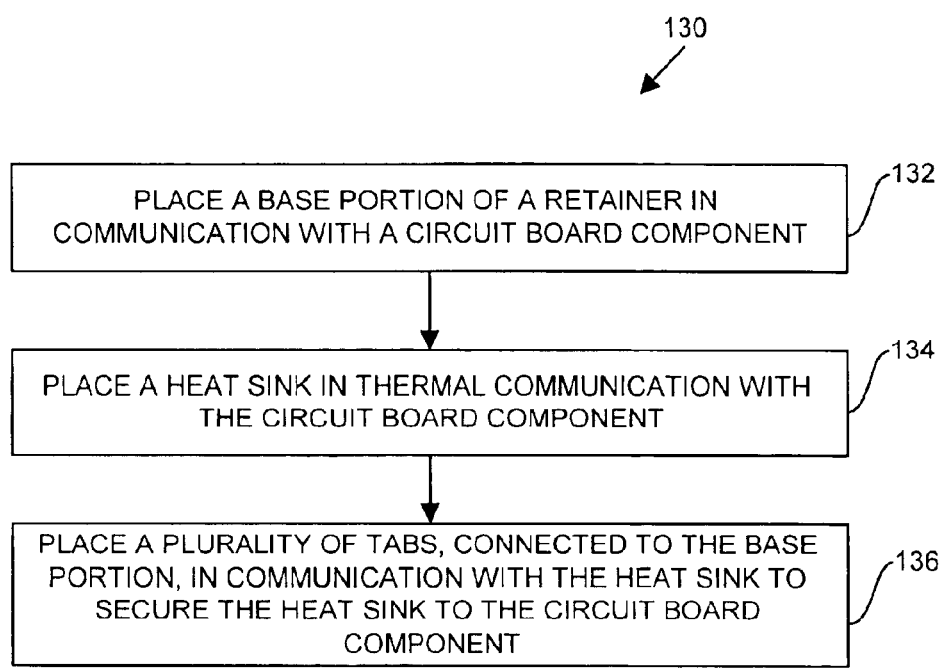
FIG. 8 illustrates a flowchart of procedure for assembling circuit board assembly, according to one embodiment of the invention.

FIG. 8 illustrates a method 130 for assembling a circuit board assembly 30, according to one embodiment of the invention. Such a method can be performed either manually (e.g., by a technician on an assembly line) or automatically (e.g., by automated equipment).

In step 132, an assembler places a base portion 60 of a retainer 42 in communication with a circuit board component 40. In one arrangement, the base portion 60 of the retainer has a first rail 100 integrally formed with, and substantially perpendicular to, a second rail 102 and has a third rail 104 integrally formed with, and substantially perpendicular to, the second rail 102. The assembler, in such an arrangement, engages the base portion 60 with a slot 90 along a perimeter portion 92 of the circuit board component 40.

In step 134, the assembler places a heat sink 38 in thermal communication with the circuit board component 40. In one arrangement, the assembler places a thermal interface material (e.g., thermally conductive putty such as Fuji-Poly) between the circuit board component 40 and the heat sink 38. The thermal interface material minimizes the presence of gaps between the heat sink 38 and circuit board component 40, thereby increasing the contacting surface areas between the heat sink 38 and the circuit board component 40.

In step 136, an assembler places a plurality of tabs 64, connected to the base portion 60, in communication with the heat sink 38 to secure the heat sink 38 to the circuit board component 40. In one arrangement, the assembler positions the tabs 64 between two adjacent fins 48 of the heat sink 38. Such positioning of the tabs 64 between adjacent fins 48 helps to minimize the potential of the retainer 42 becoming disengaged from heat sink 38 and the circuit board component 40.

While this invention has been particularly shown and described with references to preferred embodiments thereof, it will be understood by those skilled in the art that various changes in form and details may be made therein without departing from the spirit and scope of the invention as defined by the appended claims.

For example, as described above, the retainer 42 provides a mechanical attachment between the heat sink 38 and the circuit board component 40 and minimizes the necessity for the use of a thermally conductive adhesive between the heat sink 38 and the circuit board component 40. In one arrangement, the circuit board assembly 30 includes a thermally conductive adhesive, such as TennRich 8612 F (TennRich Technology) or Chromeric T411, between the heat sink 38 and the circuit board component 40. The thermally conductive adhesive acts as a thermal interface material between the heat sink 38 and the circuit board component 40. The thermally conductive adhesive helps to maintain thermal communication between, and helps to increases the amount heat transferred from, the circuit board component 40 and the heat sink 38.

FIGS. 7A and 7B illustrate attachment of a heat sink to the retainer where the heat sink substantially simultaneously contacts two latches 110-1, 110-2 to bend the arms 62-1, 62-2 away from the central axis 116 of the heat sink 38. Such attachment is byway of example only. In one arrangement, an assembler inserts the heat sink 38 at an angle relative to the circuit board component 40 such that the first latch 110-1 aligns between two adjacent fins 48 of the heat sink 38 and that the base plate 46 on the first side 108 of the heat sink 38 engages the latch 110-1. The assembler then presses the base plate 46 of the second side 109 of the heat sink 38 against the second latch 110-2, causing the second latch 110-2 to rotate away from the central axis 116 of the heat sink 38. As the base plate 46 of the heat sink 38 contacts the circuit board component 40, the second latch 110-2 retracts and allows a "snap-in" of the heat sink 38 within the retainer 42.

As described above, the retainer 42 is formed from a metallic material. In one arrangement, the retainer 42 is formed from a non-conductive material, such as a passivated stainless steel material. For example, a process of Cationic Electro Deposition (CED) renders an electrically conductive stainless steel material non-conductive. In the case where the retainer 42 is formed from a stainless steel material, the retainer 42 has the elastic material properties of the stainless steel, thereby allowing bending or deflection of portions of the retainer 42. Furthermore, because the retainer 42 is formed from a passivated material, the retainer 42 is electrically non-conductive, thereby minimizing potential for creating a short circuit with the circuit board component 40 or with the solder ball array 44 connecting the circuit board component 40 to the circuit board 36.

Such variations are intended to be covered by the scope of this invention. As such, the foregoing description of embodiments of the invention is not intended to be limiting. Rather, any limitations to the invention are presented in the following claims.

What is claimed is:

1. A retainer for securing a heat sink to a circuit board component, the retainer comprising:
   a base portion having a rail configured to engage a slot along a perimeter portion of the circuit board component;
   a plurality of arms coupled to the base portion; and
   a plurality of tabs coupled to the plurality of arms, each of the plurality of tabs configured to move between a first position and a second position relative to the base portion, the base portion, the plurality of arms, and the plurality of tabs configured, when the plurality of tabs move from the first position to the second position, to capture at least a portion of the heat sink and at least a portion of the circuit board component to secure the heat sink to the circuit board component.

2. The retainer of claim 1 wherein the base portion, the plurality of arms, and the plurality of tabs are integrally formed.

3. The retainer of claim 1 wherein each of the plurality of tabs is configured to position between two adjacent fins of the heat sink.

4. The retainer of claim 1 wherein the rail comprises a first rail, a second rail integrally formed with and substantially perpendicular to the first rail, and a third rail integrally formed with and substantially perpendicular to the second rail, the first rail, the second rail, and the third rail configured to engage the slot along the perimeter portion of the circuit board component.

5. The retainer of claim 1 wherein each of the plurality of arms comprises a latch, the latch allowing deflection of each of the plurality of arms upon placement of the heat sink in contact with the latch and configured to allow retraction of each of the plurality of arms upon placement of the heat sink in thermal communication with the circuit board component.

6. The retainer of claim 1 wherein the retainer comprises a nonconductive material.

7. A heat sink assembly comprising:
   a heat sink; and
   a retainer for securing the heat sink to a circuit board component, the retainer having:
      a base portion having a rail configured to engage a slot along a perimeter portion of the circuit board component,
      a plurality of arms coupled to the base portion, and
      a plurality of tabs coupled to the plurality of arms, each of the plurality of tabs configured to move between a first position and a second position relative to the base portion, the base portion, the plurality of arms, and the plurality of tabs configured, when the plurality of tabs move from the first position to the second position, to capture at least a portion of the heat sink and at least a portion of the circuit board component to secure the heat sink to the circuit board component.

8. The heat sink assembly of claim 7 wherein the base portion, the plurality of arms, and the plurality of tabs are integrally formed.

9. The heat sink assembly of claim 7 wherein the heat sink comprises a plurality of fins and wherein each of the plurality of tabs is configured to position between two adjacent fins of the heat sink.

10. The heat sink assembly of claim 7 wherein the rail comprises a first rail, a second rail integrally formed with and substantially perpendicular to the first rail, and a third rail integrally formed with and substantially perpendicular to the second rail, the first rail, the second rail, and the third rail configured to engage the slot along the perimeter portion of the circuit board component.

11. The heat sink assembly of claim 7 wherein each of the plurality of arms comprises a latch, the latch allowing deflection of each of the plurality of arms upon placement of the heat sink in contact with the latch and configured to allow retraction of each of the plurality of arms upon placement of the heat sink in thermal communication with the circuit board component.

12. The heat sink assembly of claim 7 wherein the retainer comprises a nonconductive material.

13. A circuit board assembly comprising:
   a circuit board and a circuit board component mounted to the circuit board; and
   a heat sink assembly for cooling the circuit board component, the heat sink assembly including:
      a heat sink in thermal communication with the circuit board component, and
      a retainer for securing the heat sink to the circuit board component, the retainer having:
         a base portion having a rail configured to engage a slot along a perimeter portion of the circuit board component,
         a plurality of arms coupled to the base portion, and
         a plurality of tabs coupled to the plurality of arms, each of the plurality of tabs moveable between a first position and a second position relative to the base portion, the base portion, the plurality of arms, and the plurality of tabs capturing, when the plurality of tabs move from the first position to the second position, at least a portion of the heat sink and at least a portion of the circuit board component to secure the heat sink to the circuit board component.

14. The circuit board assembly of claim 13 wherein the base portion, the plurality of arms, and the plurality of tabs are integrally formed.

15. The circuit board assembly of claim 13 wherein the heat sink comprises a plurality of fins and wherein each of the plurality of tabs position between two adjacent fins of the heat sink.

16. The circuit board assembly of claim 13 wherein the rail comprises a first rail, a second rail integrally formed with and substantially perpendicular to the first rail, and a third rail integrally formed with and substantially perpendicular to the second rail, the first rail, the second rail, and the third rail engaging the slot along the perimeter portion of the circuit board component.

17. The circuit board assembly of claim 13 wherein each of the plurality of arms comprises a latch, the latch allowing deflection of each of the plurality of arms upon placement of the heat sink in contact with the latch and allowing retraction of each of the plurality of arms upon placement of the heat sink in thermal communication with the circuit board component.

18. The circuit board assembly of claim 13 wherein the retainer comprises a nonconductive material.

19. A method for assembling a circuit board assembly comprising:
    enraging the base portion of a retainer with a slot alone a perimeter portion of a circuit board component;
    placing a heat sink in thermal communication with the circuit board component;
    placing a plurality of tabs, connected to the base portion, in communication with the heat sink to secure the heat sink to the circuit board component.

20. The method of claim 19 wherein the step of placing the plurality of tabs comprises positioning the plurality of tabs between two adjacent fins of the heat sink.

21. The method of claim 19 wherein the step of engaging comprises engaging the base portion with the slot along the perimeter portion of the circuit board component, the base portion having a first rail, a second rail integrally formed with and substantially perpendicular to the first rail, and a third rail integrally formed with and substantially perpendicular to the second rail.

22. A retainer for securing a heat sink to a circuit board component, the retainer means comprising:
    a base portion means having a rail configured to engage a slot along a perimeter portion of the circuit board component;
    a plurality of arm means coupled to the base portion means; and
    a plurality of tab means coupled to the plurality of arm means, each of the plurality of tab means moveable between a first position and a second position relative to the base portion means, the base portion means, the plurality of arm means, and plurality of tab means configured, when the plurality of tabs move from the first position to the second position, for capturing at least a portion of the heat sink and at least a portion of the circuit board component to secure the heat sink to the circuit board component.

23. A retainer for securing a heat sink to a circuit board component, the retainer comprising:
    a base portion;
    at least one arm coupled to the base portion; and
    a tab coupled to the at least one arm, the tab configured to move between a first position and a second position relative to the base portion and configured to position between two adjacent fins of the heat sink, the base portion, the at least one arm, and the tab configured, when the tab moves from the first position to the second position, to capture at least a portion of the heat sink and at least a portion of the circuit board component to secure the heat sink to the circuit board component.

24. A retainer for securing a heat sink to a circuit board component, the retainer comprising:
    a base;
    at least one arm coupled to the base; and
    a tab coupled to the at least one arm, the tab configured to bend relative to the at least one arm and the retainer configured to secure the heat sink to the circuit board component when the tabs bend relative to the arms from a first position to a second position to capture at least a portion of the heat sink and at least a portion of the circuit board component.

25. The retainer of claim 24 wherein the tab forms a joint with the at least one arm, the joint allowing the tab to bend relative to the arm of the retainer.

26. The retainer of claim 24 wherein the arms define an alignment platform configured to orient the heat sink relative to the circuit board component and the retainer to provide thermal communication between the heat sink and the circuit board component and to provide mechanical contact between the heat sink and the tab of the retainer.

* * * * *

UNITED STATES PATENT AND TRADEMARK OFFICE
CERTIFICATE OF CORRECTION

PATENT NO. : 6,856,511 B1
DATED : February 15, 2005
INVENTOR(S) : Rainier Viernes and Michael Chern It is certified that error appears in the above-identified patent and that said Letters Patent is hereby corrected as shown below:

Column 13,
Line 29, "enraging" should read -- engaging --.
Line 29, "alone" should read -- along --.

Signed and Sealed this

Seventh Day of June, 2005

JON W. DUDAS
*Director of the United States Patent and Trademark Office*